(12) United States Patent
Swiatnicki et al.

(10) Patent No.: US 11,929,233 B2
(45) Date of Patent: Mar. 12, 2024

(54) METHOD OF ADJUSTING THE OUTPUT POWER OF A POWER SUPPLY SUPPLYING ELECTRICAL POWER TO A PLASMA, PLASMA APPARATUS AND POWER SUPPLY

(71) Applicant: TRUMPF Huettinger Sp. z o. o., Zielonka (PL)

(72) Inventors: Jakub Swiatnicki, Zdunska Wola (PL); Krzysztof Ruda, Zielonka (PL); Mateusz Wiosna, Gluchow (PL); Grzegorz Toczylowski, Zabki (PL); Jialei Chen, Shanghai (CN)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 262 days.

(21) Appl. No.: 17/553,875

(22) Filed: Dec. 17, 2021

(65) Prior Publication Data

US 2022/0115207 A1    Apr. 14, 2022

Related U.S. Application Data

(63) Continuation of application No. PCT/CN2019/092523, filed on Jun. 24, 2019.

(51) Int. Cl.
*H01J 37/32* (2006.01)

(52) U.S. Cl.
CPC .. *H01J 37/32082* (2013.01); *H01J 37/32568* (2013.01); *H01J 37/32935* (2013.01)

(58) Field of Classification Search
CPC ........... H01J 37/32082; H01J 37/32568; H01J 37/32935; H01J 37/32036; H01J 37/32091; H01J 37/34; C23C 14/3464; C23C 14/50; C23C 14/52; C23C 14/542; C23C 14/505; C23C 14/34
See application file for complete search history.

(56) References Cited

U.S. PATENT DOCUMENTS

| 5,399,254 A | 3/1995 | Geisler et al. |
| 5,423,971 A | 6/1995 | Arnold et al. |
| 2003/0213559 A1 | 11/2003 | Goodman |
| 2004/0094412 A1 | 5/2004 | Navala et al. |
| 2011/0100806 A1 | 5/2011 | Sugawara et al. |

(Continued)

FOREIGN PATENT DOCUMENTS

| CN | 1500908 A | 6/2004 |
| CN | 102066602 A | 5/2011 |

(Continued)

*Primary Examiner* — Abdullah A Riyami
*Assistant Examiner* — Syed M Kaiser
(74) *Attorney, Agent, or Firm* — LEYDIG, VOIT & MAYER, LTD.

(57) ABSTRACT

A method adjusts an output power of a power supply supplying electrical power to a plasma in a plasma chamber. The method includes: connecting the power supply to at least one electrode in the plasma chamber; transporting one or more substrates relative to the electrode using a substrate carrier; maintaining the plasma by the electrical power; processing the one or more substrates with the plasma; and adjusting the output power based on a parameter related to a distance between a surface of the electrode facing a carrier-substrate-assembly and a surface of the substrate-carrier-assembly facing the electrode.

15 Claims, 3 Drawing Sheets

(56) References Cited

U.S. PATENT DOCUMENTS

2011/0209986 A1    9/2011    Kitada et al.
2017/0207071 A1    7/2017    De Bosscher et al.

FOREIGN PATENT DOCUMENTS

| | | | |
|---|---|---|---|
| CN | 104241077 A | * 12/2014 | |
| CN | 106256927 A | * 12/2016 | ............. C23C 14/34 |
| CN | 106256927 A | 12/2016 | |
| DE | 10135761 A1 | 4/2002 | |
| DE | 102012109093 A1 | 9/2013 | |
| DE | 102012110043 A1 | 12/2013 | |
| DE | 102019200761 A1 | 7/2020 | |
| JP | 2006032795 A | * 2/2006 | |
| JP | 2014135478 A | * 7/2014 | ....... G02F 1/133345 |
| JP | 2016069727 A | 5/2016 | |
| WO | WO-2017153638 A1 | * 9/2017 | ......... C23C 16/4401 |
| WO | WO 2020152097 A1 | 7/2020 | |

\* cited by examiner

METHOD OF ADJUSTING THE OUTPUT POWER OF A POWER SUPPLY SUPPLYING ELECTRICAL POWER TO A PLASMA, PLASMA APPARATUS AND POWER SUPPLY

CROSS REFERENCE TO RELATED APPLICATIONS

This application is a continuation of International Application No. PCT/CN2019/092523 (WO 2020/257965 A1), filed on Jun. 24, 2019. The aforementioned applications are hereby incorporated by reference herein.

FIELD

The invention relates to a method of adjusting the output power of a power supply supplying electrical power to a plasma in a plasma chamber. Furthermore, the invention relates to a plasma apparatus for processing substrates in a plasma chamber, and to a power supply with a control for controlling the process in a plasma chamber.

BACKGROUND

Plasma processes are being used for treating substrates, in particular for depositing layers on substrates, for example by means of sputtering. Furthermore, substrates can be etched in a plasma process. When etching or depositing on flat or three-dimensional substrates, unequal layer thicknesses have been observed. The problem arises in particular, when several, in particular different, substrates are processed in the same plasma chamber.

SUMMARY

In an embodiment, the present disclosure provides a method that adjusts an output power of a power supply supplying electrical power to a plasma in a plasma chamber. The method includes: connecting the power supply to at least one electrode in the plasma chamber; transporting one or more substrates relative to the electrode using a substrate carrier; maintaining the plasma by the electrical power; processing the one or more substrates with the plasma; and adjusting the output power based on a parameter related to a distance between a surface of the electrode facing a carrier-substrate-assembly and a surface of the substrate-carrier-assembly facing the electrode.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

One or more aspects of the present invention provide a method and apparatus ensuring uniform processing of substrates, in particular avoiding unequal layer thicknesses on substrates.

According to one aspect of the present invention, a method of adjusting the output power of a power supply supplying electrical power to a plasma in a plasma chamber is provided. The method includes:
a) connecting the power supply to at least one electrode in the plasma chamber,
b) transporting one or more substrates relative to the electrode using a substrate carrier,
c) maintaining the plasma by the electrical power,
d) processing the substrate(s) by means of plasma,
e) adjusting the power based on a parameter related to the distance between the surface of the electrode facing a carrier-substrate assembly and the surface of the substrate-carrier assembly facing the electrode.

Processing can comprise depositing, coating, sputtering, reactive sputtering, etching, ashing, etc. Advantageously, two electrodes are associated with, i.e. connected to, one power supply. If several power supplies are provided, each power supply can be associated with, in particular connected to, one or several electrodes. The one or two electrodes can be embodied as a target or connected to a target. Preferably, the electrode(s) are embodied as rotating electrodes. Using the method of an embodiment of the invention, layers can be deposited on metal, glass, plastics, and other materials. The substrates to be processed in the plasma chamber may be large glass substrates or may as well be small parts, for example parts of housings of electronic components, optical components such as lenses, or decorative automotive parts. Often, the substrates to be processed in the plasma chamber are not completely flat but have a three-dimensional form.

A substrate-carrier assembly is a carrier, on which one or more substrates are positioned. The substrate carrier typically moves together with the substrate(s). It also possible, that the substrate(s) move and the substrate carrier is fixed such as in an in-line coater, where the substrates move on rollers. Gaps may be present between two neighboring substrates such that the substrate carrier surface is facing an electrode rather than a substrate surface. Part of the plasma diffuses into the gaps between substrates. It has been found that for a uniform treatment (depositing or etching) more power has to be supplied to the plasma when a gap, i.e. a carrier surface, faces the electrode. The power may depend on the depth and/or width of the gap.

The distance between the substrate-carrier assembly and the electrode may be understood to be the distance in a direction orthogonal to the surface of the electrode. The distance can be between a substrate and an electrode or between a surface of the carrier in a gap between two substrates and the electrode. Alternatively, the distance may be the shortest distance between substrate and electrode or between surface of the carrier and the electrode.

If the plasma is established using more than one electrode, then the distance between the substrate-carrier assembly and the electrode may be understood to be the distance between:
the first, second, third, . . . , or last electrode in direction of the transport direction of the substrate-carrier-assembly the shortest, longest, median, average, or other predetermined distance of the electrodes and the substrate-carrier-assembly, any other predetermined calculation method.

A parameter related to the distance between the surface of the electrode facing a carrier-substrate assembly and the surface of the substrate-carrier assembly facing the electrode may be the distance itself. Alternatively, it may be the height of the substrate-carrier assembly or the elevation of the carrier surface or the substrate surface above the carrier surface.

A topography of the substrate-carrier assembly could be established and be the basis to determine the distance between the substrate-carrier assembly and the electrode. Hence, the topography may also be a parameter related to the distance between the surface of the electrode facing a carrier-substrate assembly and the surface of the substrate-carrier assembly facing the electrode Adjusting the power based on the parameter related to distance may have a general meaning and also include adjusting the power in dependence of substrate position relative to the electrode and in dependence of the shape of the substrate-carrier assembly.

Adjusting the power based on the parameter related to distance may also mean adjusting the power at least partially:

proportionally, logarithmic stepwise as a deviation of the distance, according to a given look-up table, or in a combination of the foregoing.

Results on the plasma processed substrate, especially according to quality, could be diagnosed, in particular by automated functionality, and fed back in an algorithm. The algorithm may be configured to find the best power adjust values. This may be done with a machine learning algorithm. This could be done with computerized neuronal networks.

By adjusting the power supplied to an electrode based on the parameter related to the distance between the electrode and the particular substrate being processed in the vicinity of the particular electrode, the thickness of the layer deposited on the substrate can be influenced. In particular, if several substrates having different thicknesses, i.e. distances between the substrate and the electrode, are being treated in the same plasma chamber, it can be ensured that the layer thickness of the deposited layer on all the substrates is the same, if the power supplied to the electrode is adjusted based on the distance between the substrate and the electrode. For example, for a longer distance between the substrate and the electrode, a higher power can be used.

According to one method variant, the thickness of a substrate can be measured, or if known, input to a control, and from the thickness of the substrate the distance between the substrate and the electrode or a parameter related to the distance can be determined. However, preferably the distance between the electrode and the substrate or a parameter related thereto is measured. A measured distance or parameter can be input to a control and the control can be used to adjust the output power of the power supply.

In particular, a parameter related to the distance between the substrate and the electrode may be input to a control inside the power supply, wherein the output power is adjusted by the control. Using an internal control is much faster and more reliable and precise than using an external control connected to the power supply. This makes the results of the plasma process also more uniform.

The power supply may deliver AC power, in particular at a frequency between 0.1 kHz and 200 kHz. The power supply may be a bipolar pulsed power supply. The AC, especially bipolar pulsed power supply may be connectable or connected to two electrodes both working as cathodes in an AC plasma process.

Further advantages arise, if the output power of the power supply is adjusted based on the relative position between the electrode and the substrate. The relative position of the electrode and the substrate may be determined in the direction of movement of the substrate relative to the electrode. In particular, the relative position of the electrode and the substrate is not to be determined in the direction in which the distance between the substrate and the electrode is determined. In particular, the relative position of the electrode and the substrate may be determined in the direction orthogonal to the direction in which the distance between the substrate and the electrode is determined.

The relative position of the electrode and the substrate can be determined based on a position of the substrate carrier and a known position of the substrate on the substrate carrier and a known position of the electrode. Furthermore, the relative position of the electrode and the substrate can be the amount of overlap of the electrode and the substrate to be processed.

If the topography of the substrate-carrier assembly is the basis to determine the distance between the substrate-carrier assembly and the electrode, this topography may be assigned to a determined position on the carrier.

The output power may be adjusted in a stepwise manner, in a linear manner or according to o a given function. For example, for each substrate and/or for each gap between substrates, a (different) constant output power can be adjusted. Alternatively, the output power can be increased or decreased linearly as a substrate is being moved relative to the electrode. Furthermore, the output power can change according to a function. In particular, the output power can change according to the profile (topography) of the surface of a substrate.

The output power may be adjusted based on the position of a carrier carrying one or more substrates. In particular, the output power can be synchronized to the position of a carrier. For example, for a rotating carrier the output power can be synchronized to the output carrier passing a given position.

Information related to the topography of the substrate and/or the substrate-carrier assembly may be determined. This may be done in a calibration step or during the processing, i.e. when a plasma is present in the plasma chamber, for example while another substrate is processed in the plasma chamber, i.e. before the substrate is moved to a plasma processing position. By determining the topography of a substrate, more detailed distance information becomes available and the output power can be adjusted more precisely.

The adjustment of power may be synchronized with the position of the carrier, in order to adjust the output power at exactly the right moment.

According to another aspect, the present invention provides a plasma apparatus comprising:

a) a plasma chamber, b) at least one electrode positioned inside the plasma chamber, at least one power supply connected to the electrode and configured to supply power to the electrode in order to maintain a plasma to process one or more substrates in the plasma chamber, a) a substrate carrier for transporting the one or more substrates relative to the at least one electrode,
b) a control for controlling the output power of the power supply based on a parameter related to the distance between the at least one electrode and the surface of the substrate-carrier assembly facing the electrode.

A substrate-carrier assembly is to be understood to be a substrate carrier, on which one or more substrates are disposed. Depending on the position of the substrate carrier, the surface of the substrate-carrier assembly directly facing the electrode is either the surface of the substrate disposed on the substrate carrier or the surface of the carrier. With varying distances between the electrode and the surface of the substrate-carrier assembly, different output power may be applied. For example, if the electrode is facing a gap between two substrates, i.e. a surface of the substrate carrier, a larger output power may be used compared to the case when the surface of a substrate disposed on the substrate carrier is facing the electrode.

In one embodiment, a height profile can be input to a control for controlling the output power. From the height profile, the distance between the surface of the substrate-carrier assembly and a particular electrode may be determined for a particular position of the substrate carrier. In the alternative, a sensor may be provided for measuring the distance between the surface of a substrate-carrier assembly and the electrode surface, or a quantity related to the distance. The distance between the surface of the electrode and the surface of the substrate-carrier assembly or the parameter related to the distance may be determined perpendicular to the surface of the electrode. Alternatively, the distance may be the shortest distance between the electrode surface and the surface of the substrate-carrier assembly.

The surface of a substrate may also vary. Thus the distance between the surface of the substrate and the surface of the electrode may vary as the substrate is being moved relative to the electrode. Thus, the distance between the surface of the substrate and the surface of the electrode may vary even for one substrate. Hence, the output power may vary as the substrate is moved relative to the electrode, depending on the varying distance (or a parameter related thereto).

A sensor may be provided for determining the position of the substrate carrier and/or the substrate relative to a fixed position and/or an electrode. Thus it can be determined, which substrate is facing a particular electrode, or if a gap is facing a particular electrode. The power may be adjusted based on the determined position of the substrate carrier.

In order to improve the throughput of the plasma apparatus, two or more power supplies, each connected to one or more electrodes, may be provided. The two or more power supplies may be operated at different output powers, depending on which substrate they are facing, in particular depending on the distance between the surface of the substrate and the surface of their respective electrode(s).

A sensor for determining the topography of a substrate may be provided. Using the topography of a substrate, a more precise control of the output power is possible.

According to a further aspect, the present invention provides a power supply with a control,
a) the power supply being configured to supply a power to maintain a plasma in a plasma chamber,
b) the control further being configured to receive information about the distance between a least one electrode in the plasma chamber and the surface of a substrate-carrier assembly facing the electrode,
c) the control further being configured to adjust the output power of the power supply based on a power supply set value, the power supply set value determined by adding or subtracting a distance-dependent power value to or from a given power set value.

Thus, the power output by a power supply can be adjusted based on the particular substrate facing the electrode or electrodes connected to the power supply. If a smaller distance is determined between the surface of the electrode and the surface of the substrate, a power value can be subtracted from the given power set value. If on the other hand a larger distance is determined between the surface of the electrode and the surface of the substrate, a power value may be added to the given power set value. Thus, more uniform processing of the substrates can be ensured. Even with flat substrates, the invention has advantages. The gaps between flat substrates have negative impact on the results of the plasma processes on the substrates which can be balanced with the described adjustment of power.

Figure 1:
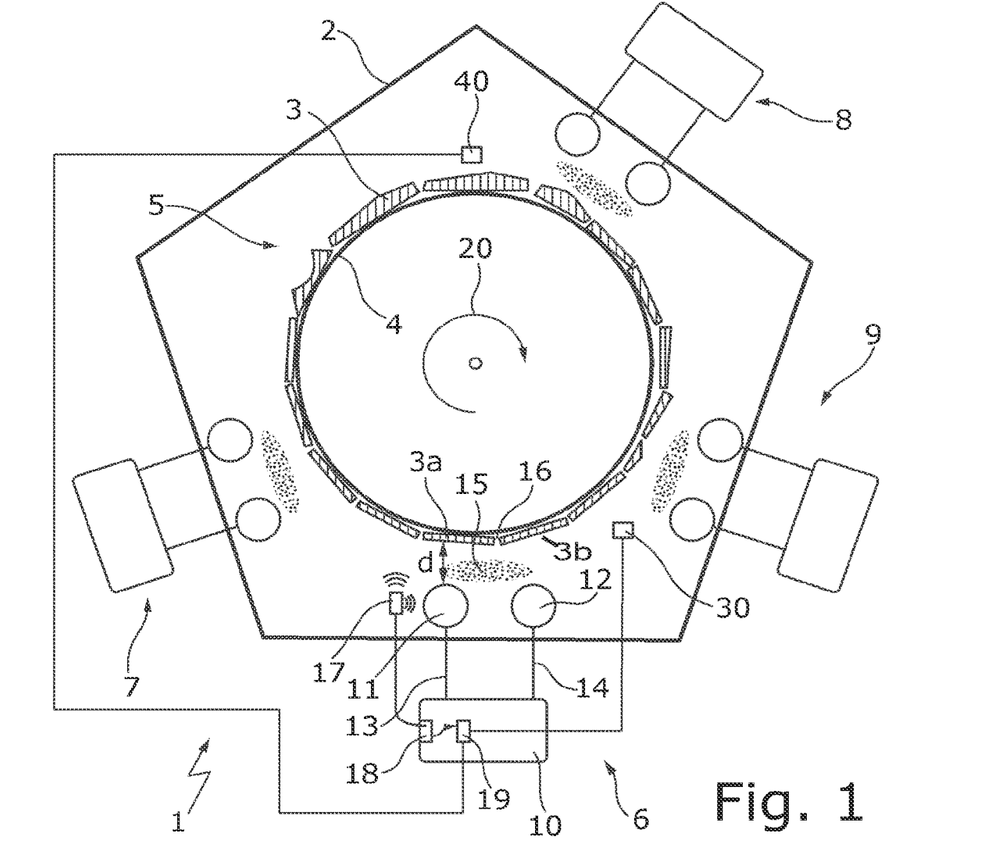
FIG. 1 shows a schematic illustration of a first plasma apparatus.

FIG. 1 shows a plasma apparatus 1. The plasma apparatus 1 comprises a plasma chamber 2 for processing substrates 3, which are disposed on a substrate carrier 4. The substrates 3 and the substrate carrier 4 together form a substrate-carrier assembly 5. In this embodiment, the substrate carrier is embodied as a rotating drum, rotating in direction of arrow 20.

The plasma apparatus 1 comprises several electrode-power supply assemblies 6 to 9. In the following, only electrode-power supply assembly 6 will be described. The other electrode-power supply assemblies 7 to 9 may be embodied alike. Additional electrode-power supply assemblies may also be provided.

The electrode-power supply assembly 6 comprises a power supply 10 connected to electrodes 11, 12 via power lines 13, 14. The electrodes 11, 12 are arranged within the plasma chamber 2. By supplying power to the electrodes 11, 12 a plasma 15 may be formed and maintained in the plasma chamber 2. As can be seen, plasma 15 is formed in the region between the electrodes 11, 12 and the substrate-carrier assembly 5 directly facing the electrodes 11, 12. Thus, in the illustration shown, substrate 3a is being processed.

As can be seen in FIG. 1, the substrates 3, 3a have different shapes. In particular, they have different heights. This results in a distance d—shown between substrate 3a and electrode 11—to change as a substrate is moved past the particular electrode 11,12. In order to obtain a uniform processing of all the substrates 3, 3a, the output power of a power supply 10 is adjusted dependent on the distance d between the substrate 3a facing the surface of the electrode 11. Furthermore, if a gap 16 between two substrates 3a, 3b, i.e. a surface of the substrate carrier 4, is facing a particular electrode 11,12, the output power of the power supply 10 also is adjusted.

In the embodiment shown, a distance sensor 17 connected to a distance sensor input 18 is being used for determining the distance between the electrode 11 and the substrate 3a facing the electrode 11. The distance sensor 17 is connected to a control 19 inside the power supply 10 via the distance sensor input 18. The control 19 adjusts the output power of the power supply 10 based on the determined distance. This may mean that the power supply 10 may get a given set point value from an external control. The power supply 10 may output this set point value only for one or some of the distances d. With varying distances d the output power may vary based on the distances d, although the external given set point remains constant. If the external given set point varies, then the new given set point is the new basic set point, and again, with varying distances d the output power may vary based on the distances d. The change of the new basic set point could be postponed by the control 19 of the power supply 10 to a moment where the carrier-substrate-assembly position relative to the electrode 11, 12 reaches a certain point.

Furthermore, the output power of the power supply 10 may be dependent on the position of the substrate carrier 4. If the position of the substrate carrier 4 is known, one also knows which substrate 3*a* is facing a particular electrode 11. In order to determine the position of the substrate carrier 4, a position sensor 30 may be provided. The position sensor 30 may also be connected to the control 19. Thus, this information can also be used for adjusting the output power of the power supply 10. In particular a relative position (in direction of arrow 20) of the substrate 3*a* and the electrode 11 can be determined and used for adjusting the output of the power supply 10.

Additionally, a sensor 40 may be provided for determining the topography of a particular substrate 3, 3*a*. From the information about the topography of a substrate 3, 3*a*, the distance between the surface of the substrate 3, 3*a* and a particular electrode 11 can be determined, thus, the output power of a power supply 10 can be adjusted.

Figure 2:
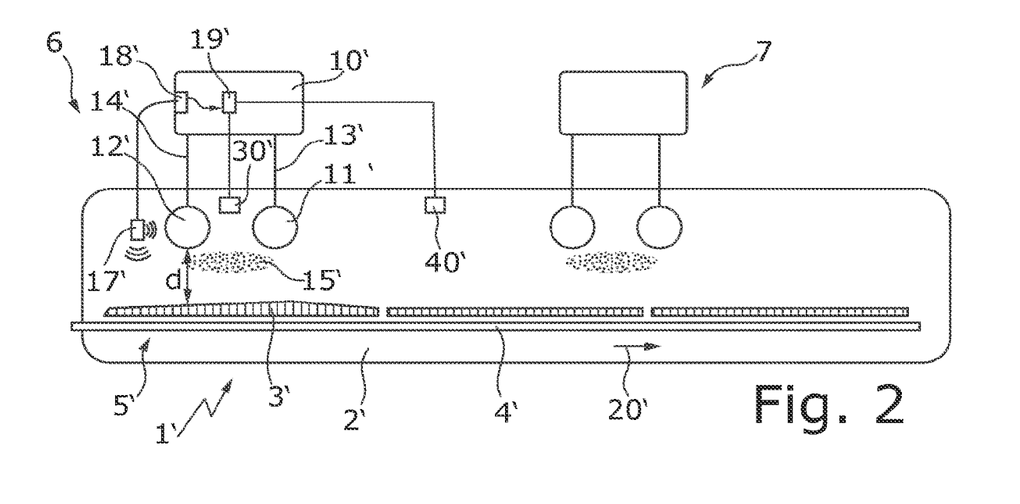
FIG. 2 shows a schematic illustration of a second embodiment of a plasma apparatus.

FIG. 2 shows a plasma apparatus 1'. This may be a structure of an in-line coater. The plasma apparatus 1' comprises a plasma chamber 2' for processing substrates 3', which are disposed on a substrate carrier 4'. The substrates 3' and the substrate carrier 4' together form a substrate-carrier assembly 5'. The plasma apparatus 1' comprises several electrode-power supply assemblies 6', 7'. In the following, only electrode-power supply assembly 6' will be described. The other electrode-power supply assembly 7' may be embodied alike. Additional electrode-power supply assemblies may also be provided.

The electrode-power supply assembly 6' comprises a power supply 10' connected to electrodes 11', 12' via power lines 13', 14'. The electrodes 11', 12' are arranged within the plasma chamber 2'. By supplying power to the electrodes 11', 12' a plasma 15' may be formed and maintained in the plasma chamber 2'. As can be seen, plasma 15' is formed in the region between the electrodes 11', 12' and the substrate carrier assembly 5' directly facing the electrodes 11', 12'. Thus, in the illustration shown, substrate 3' is being processed.

As can be seen in FIG. 2, the substrates 3' have different shapes. In particular, they have different heights. This results in a distance d between the substrate 3' and an electrode 11' to change as a substrate 3' is moved past the particular electrode 11'. In order to obtain a uniform processing of all the substrates 3', the output power of the power supply 10' has to be adjusted dependent on the distance d of substrate 3' facing the surface of the electrode 11'. Furthermore, if a gap 16' between two substrates 3' is facing a particular electrode 11', the output power of a power supply 10' also has to be adjusted. In this case, the surface of the substrate carrier 4' is facing the electrode 11'.

In the embodiment shown, a distance sensor 17' connected to a distance sensor input 18' is being used for determining the distance between the electrode 11' and a substrate 3' facing the electrode 11'. The distance sensor 17' is connected to a controller 19' inside the power supply 10' via the distance sensor input 18'. The control 19' adjusts the output power of the power supply 10' based on the determined distance.

Furthermore, the output power of the power supply 10' may be dependent on the position of the substrate carrier 4'. If the position of the substrate carrier 4' is known, one also knows which substrate 3' is facing a particular electrode 11', 12'. In order to determine the position of the substrate carrier 4', a position sensor 30' may be provided. The position sensor 30' may also be connected to the control 19'. Thus, this information can also be used for adjusting the output power of the power supply 10'.

Additionally, a sensor 40' may be provided for determining the topography of a particular substrate 3'. From the information about the topography of a substrate 3', the distance between the surface of the substrate 3' and a particular electrode 11', 12' can be determined. Thus, the output power of a power supply 10' can be adjusted.

Figure 3:
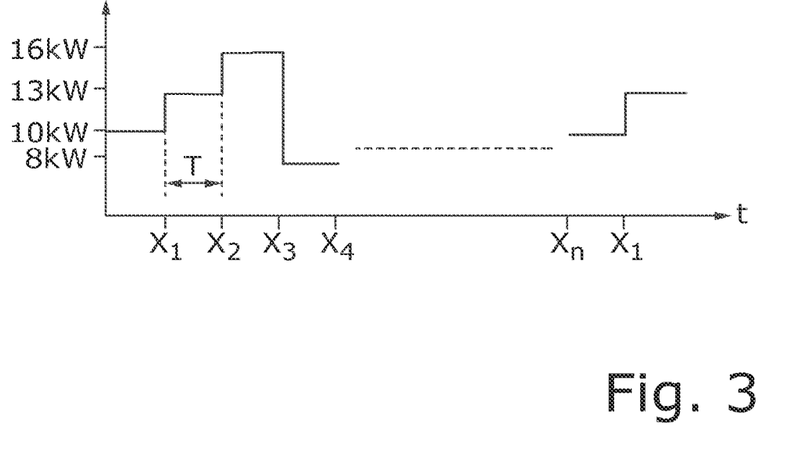
FIG. 3 shows adjusting the output power over time.

FIG. 3 shows the adjustment of the power set point of the power supply 10. A given power supply set point for a particular plasma process is in this case 10 kW. It has been determined that the distance between the surface of the next substrate to be processed and the surface of the electrode is larger than the nominal distance. Therefore, at time X1 a distance-dependent power value is added to the given power set value. Thus, the power supply set value for processing the next substrate in this case is 13 kW. For the next substrate, an even larger distance exists between the surface of the substrate and the surface of the electrode. Therefore, a distance dependent power value of 6 kW is added to a given power set value of 10 kW. Thus, the power supply set value is 16 kW.

For the third substrate, a much smaller distance has been established between the surface of the substrate and the surface of the electrode. Therefore, a distance dependent power value of 2 kW is subtracted from the given power set value of 10 kW and the output power is set at 8 kW. If a substrate carrier is a rotating drum, the first substrate is facing the electrode again after a full rotation of the substrate carrier. Therefore, at the second time X1, the same power supply set value is used again. The setting of a new power supply set value at X1 can be synchronized to the movement of a substrate carrier, i.e. the rotating drum.

More generally, the power supply may receive from an interface or external control an actual set point of output power, i.e. a given power supply set point (Psetpoint). This value may be changed by distance-dependent power values (Pstep) stored in a list of n steps, where n is the number of substrates to be processed. For each substrate to be processed, a distance-dependent power value may be stored. The power supply set value (Psetvalue) may be calculated by the equation: Psetvalue=Psetpoint+Pstep [k]. Where k is the number of steps from 1 to n.

Hence, a set point modulation is carried out. The full sequence of the set point modulation will change periodically (for a rotating substrate carrier) by the time Tperiod, calculated from equation Tperiod=1/Modulation frequency. The power supply set value will change every Tstep time, which will be calculated from equation: Tstep=Tperiod/n. Where n is the number of entries in the list, i.e. the number of substrates being processed.

Additionally, changing the power supply set value may be synchronized with the drum rotation (substrate carrier rotation) in order to change power at the correct moment. A position sensor may be mounted on the substrate carrier, giving a synchronization signal every time when substrate carrier makes a full rotation. The power supply will then adjust the output power exactly at this moment.

Figure 4:
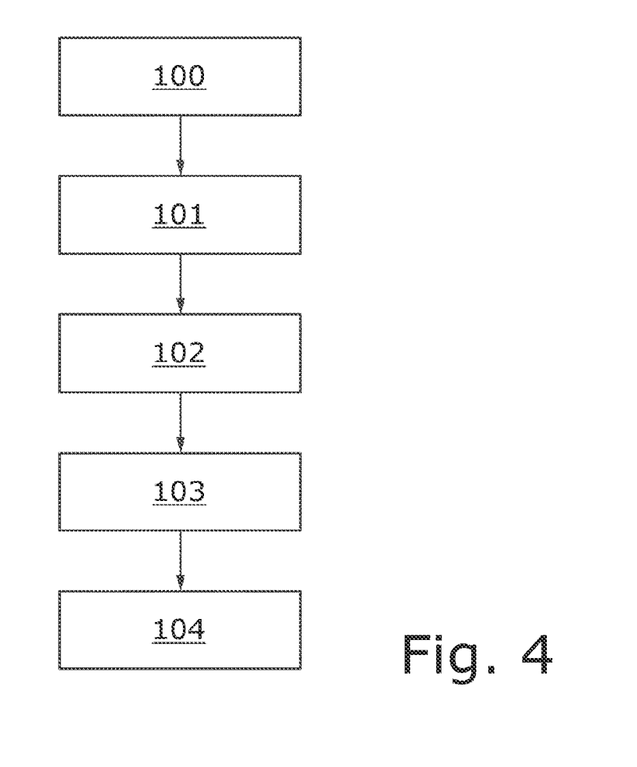
FIG. 4 shows a schematic diagram illustrating an aspect of the inventive method.

FIG. 4 shows a schematic diagram of an aspect the inventive method.

In step 100, the power supply is connected to at least one electrode in a plasma chamber.

In step 101, one or more substrates are transported relative to the electrode using a substrate carrier.

In step 102, the plasma is maintained by supplying electrical power to the plasma chamber.

In step 103, the substrate is processed by means of the plasma.

In step 104, the power supply is adjusted based on a distance between the surface of the electrode facing a carrier substrate assembly and the surface of a substrate carrier assembly facing the electrode.

Figure 5A:
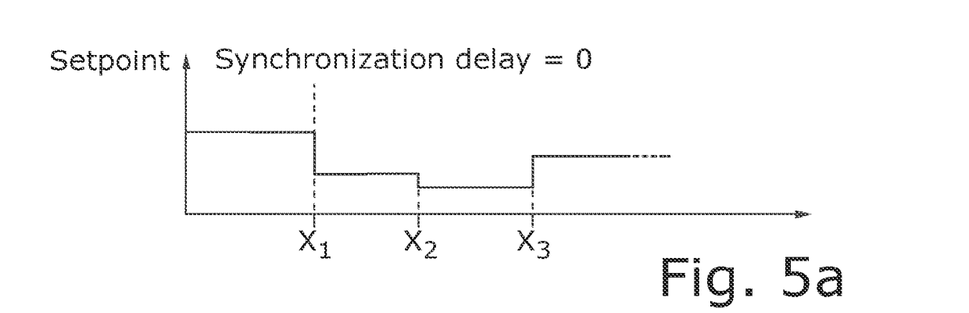
FIG. 5a-5c show synchronization of power modulation with substrate carrier position.
Figure 5B:
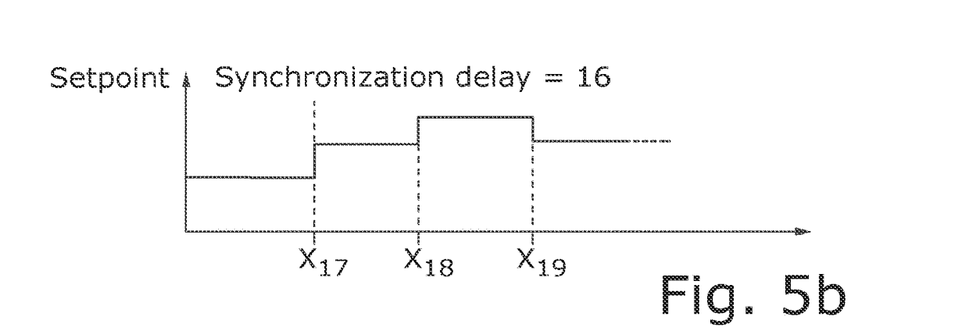
Figure 5C:
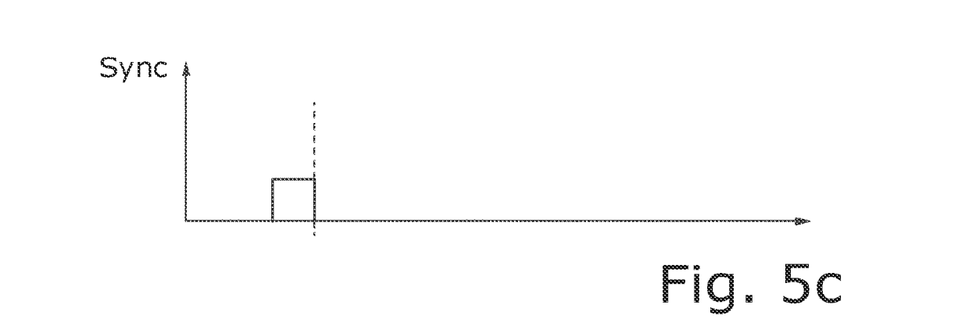

FIG. 5a-5c show graphs for illustration synchronization of the power adjustment (power modulation) with carrier position. If a user has input a height profile (topography) of a substrate-carrier assembly and the control has calculated a corresponding power supply set value profile, the adjustment of the power has to occur at the correct moment. However, the signal of the position sensor may or may not coincide with the beginning of the power supply set value profile. In FIG. 5a the synchronization signal of FIG. 5c coincides with the beginning of the power supply set value profile. Hence, the delay is 0.

On the other hand, in FIG. 5b the synchronization signal and the beginning of the power supply set value profile do not coincide. Therefore, in this case a delay or offset of 16 is used and the power adjustment begins at step 17 of the previously mentioned list of stored distance-dependent power values.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of adjusting an output power of a power supply supplying electrical power to a plasma in a plasma chamber, the method comprising:
   connecting the power supply to at least one electrode in the plasma chamber;
   transporting one or more substrates relative to the electrode using a substrate carrier;
   maintaining the plasma by the electrical power;
   processing the one or more substrates with the plasma; and
   adjusting the output power based on a parameter related to a distance between a surface of the electrode facing a carrier-substrate-assembly and a surface of the substrate-carrier-assembly facing the electrode.

2. The method according to claim 1, the method comprising measuring the distance between the electrode and the substrate-carrier-assembly or the parameter related thereto.

3. The method according to claim 1, wherein the parameter related to the distance between the substrate-carrier-assembly and the electrode is input to a control inside the power supply, wherein the output power is adjusted by the control.

4. The method according to claim 1, wherein the power supply delivers alternating-current (AC) power, with a frequency between 0.1 kHz and 200 kHz.

5. The method according to claim 1, wherein the output power of the power supply is adjusted based on the relative position of the electrode and the substrate.

6. The method according to claim 1, wherein the output power is adjusted in a step-wise manner, linear manner, or according to a predetermined function.

7. The method according to claim 1 wherein the output power is adjusted based on the position of the substrate carrier carrying one or more substrates.

8. The method according to claim 1 wherein information related to a topography of the one or more substrates or the substrate-carrier assembly is determined.

9. The method according to claim 1, wherein the adjustment of the output power is synchronized with the position of the carrier.

10. A plasma apparatus, the plasma apparatus comprising:
    a plasma chamber;
    at least one electrode positioned inside the plasma chamber;
    at least one power supply connected to the electrode and configured to supply power to the electrode in order to maintain a plasma to process one or more substrates in the plasma chamber;
    a substrate carrier for transporting the one or more substrates relative to the at least one electrode; and
    a control configured to control the output power of the power supply based on a parameter related to a distance between the at least one electrode and a surface of the substrate-carrier-assembly facing the electrode.

11. The plasma apparatus according to claim 10, the plasma apparatus comprising a sensor configured to measure the distance between the surface of the substrate-carrier assembly and the electrode surface.

12. The plasma apparatus according to claim 10, the plasma apparatus comprising a sensor configured to determine the position of the substrate carrier or the substrate relative to a fixed position or an electrode.

13. The plasma apparatus according to claim 10, wherein two or more power supplies each connected to one or more electrodes.

14. The plasma apparatus according to claim 10, the plasma apparatus comprising a sensor configured to determine topography of the one or more substrates.

15. A power supply, the power supply comprising:
    a controller,
    the power supply being configured to supply power to maintain a plasma in a plasma chamber,
    the controller being configured to receive information about a distance between at least one electrode in the plasma chamber and a surface of a substrate-carrier-assembly facing the electrode, and the controller being configured to adjust the output power of the power supply based on a power supply set value, the power supply set value being determined by adding or subtracting a distance-dependent power value to or from a given power set value.

* * * * *